United States Patent
Hu et al.

(10) Patent No.: US 10,522,369 B2
(45) Date of Patent: Dec. 31, 2019

(54) METHOD AND SYSTEM FOR CLEANING WAFER AND SCRUBBER

(71) Applicant: Taiwan Semiconductor Manufacturing Co., Ltd, Hsin-Chu (TW)

(72) Inventors: Chien-Chun Hu, Taichung (TW); Chen-Liang Chang, New Taipei (TW); Ju-Ru Hsieh, Taipei (TW); Po-Chia Chen, Taichung (TW); Shun-Yu Chuang, Taichung (TW); Wei-Tuzo Lin, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 80 days.

(21) Appl. No.: 14/632,103

(22) Filed: Feb. 26, 2015

(65) Prior Publication Data

US 2016/0254170 A1    Sep. 1, 2016

(51) Int. Cl.
| | |
|---|---|
| *H01L 21/67* | (2006.01) |
| *B08B 3/12* | (2006.01) |
| *B08B 3/10* | (2006.01) |
| *B08B 1/04* | (2006.01) |

(52) U.S. Cl.
CPC ......... *H01L 21/67046* (2013.01); *B08B 1/04* (2013.01); *B08B 3/102* (2013.01); *B08B 3/12* (2013.01); *H01L 21/67051* (2013.01)

(58) Field of Classification Search
CPC ..... H01L 21/67046; B08B 1/002; B08B 3/12; B08B 3/102

USPC ........ 134/902, 1, 1.3, 26, 102.1, 102.2, 184, 134/34, 153, 17, 86
See application file for complete search history.

(56) References Cited

U.S. PATENT DOCUMENTS

| | | | | |
|---|---|---|---|---|
| 5,450,744 | A | * | 9/1995 | Martyn ............... B01D 35/143 324/453 |
| 5,531,861 | A | * | 7/1996 | Yu ....................... B24B 37/013 134/1 |

(Continued)

FOREIGN PATENT DOCUMENTS

| | | |
|---|---|---|
| TW | 200805466 | 1/2008 |
| TW | I312538 B | 7/2009 |
| TW | 201207902 | 2/2012 |

OTHER PUBLICATIONS

Chinese language office action dated Aug. 3, 2016, issued in application No. TW 104137126.

(Continued)

*Primary Examiner* — Nadine G Norton
*Assistant Examiner* — Christopher Remavege
(74) *Attorney, Agent, or Firm* — McClure, Qualey & Rodack, LLP (57) ABSTRACT

A method of cleaning a wafer in semiconductor fabrication is provided. The method includes cleaning a wafer using a wafer scrubber. The method further includes moving the wafer scrubber into an agitated cleaning fluid. The method also includes creating a contact between the wafer scrubber and a cleaning stage in the agitated cleaning fluid. In addition, the method includes cleaning the wafer or a second wafer by the wafer scrubber after the wafer scrubber is cleaned by the agitated cleaning fluid.

19 Claims, 7 Drawing Sheets

(56) References Cited

U.S. PATENT DOCUMENTS

| | | | | |
|---|---|---|---|---|
| 5,693,148 | A | * | 12/1997 | Simmons ............... A46B 17/04 |
| | | | | 134/1.3 |
| 5,800,626 | A | * | 9/1998 | Cohen ....................... B08B 3/12 |
| | | | | 134/1.3 |
| 6,006,765 | A | * | 12/1999 | Skrovan .................. B08B 3/102 |
| | | | | 134/1 |
| 8,404,056 | B1 | * | 3/2013 | Chen ......................... B08B 3/00 |
| | | | | 134/111 |
| 2007/0251035 | A1 | * | 11/2007 | Peng ..................... A46B 17/06 |
| | | | | 15/77 |
| 2007/0267040 | A1 | * | 11/2007 | Watanabe ......... H01L 21/67057 |
| | | | | 134/1 |
| 2012/0019804 | A1 | | 1/2012 | Tanaka et al. |
| 2014/0261537 | A1 | * | 9/2014 | Chang ............... H01L 21/67046 |
| | | | | 134/6 |
| 2015/0027489 | A1 | * | 1/2015 | Lyu ................... H01L 21/67046 |
| | | | | 134/1 |

OTHER PUBLICATIONS

Chinese language office action dated Feb. 5, 2018, issued in application No. CN 201510446545.X.

* cited by examiner

METHOD AND SYSTEM FOR CLEANING WAFER AND SCRUBBER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

A critical condition in semiconductor manufacturing is the absence of contaminants on the wafer processing surface, since contaminants including, for example, microscopic particles may interfere with and adversely affect subsequent processing steps leading to device degradation and ultimately semiconductor wafer rejection. While the wafer cleaning process has always been a critical step in the semiconductor wafer manufacturing process, ultra-clean wafers are becoming even more critical to device integrity. For example, as semiconductor feature sizes decrease, the detrimental effect of particle contaminants increases, requiring removal of ever smaller particles. Furthermore, as the number of device layers increase, there is a corresponding increase in the number of cleaning steps and the potential for device degradation caused by particulate contaminants. To adequately meet requirements for ultra-clean wafers in ULSI and VLSI, the wafer surface needs to be essentially free of contaminating particles.

It is desired to have methods and system for cleaning wafers to reduce contaminants or particles on the wafers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 1:
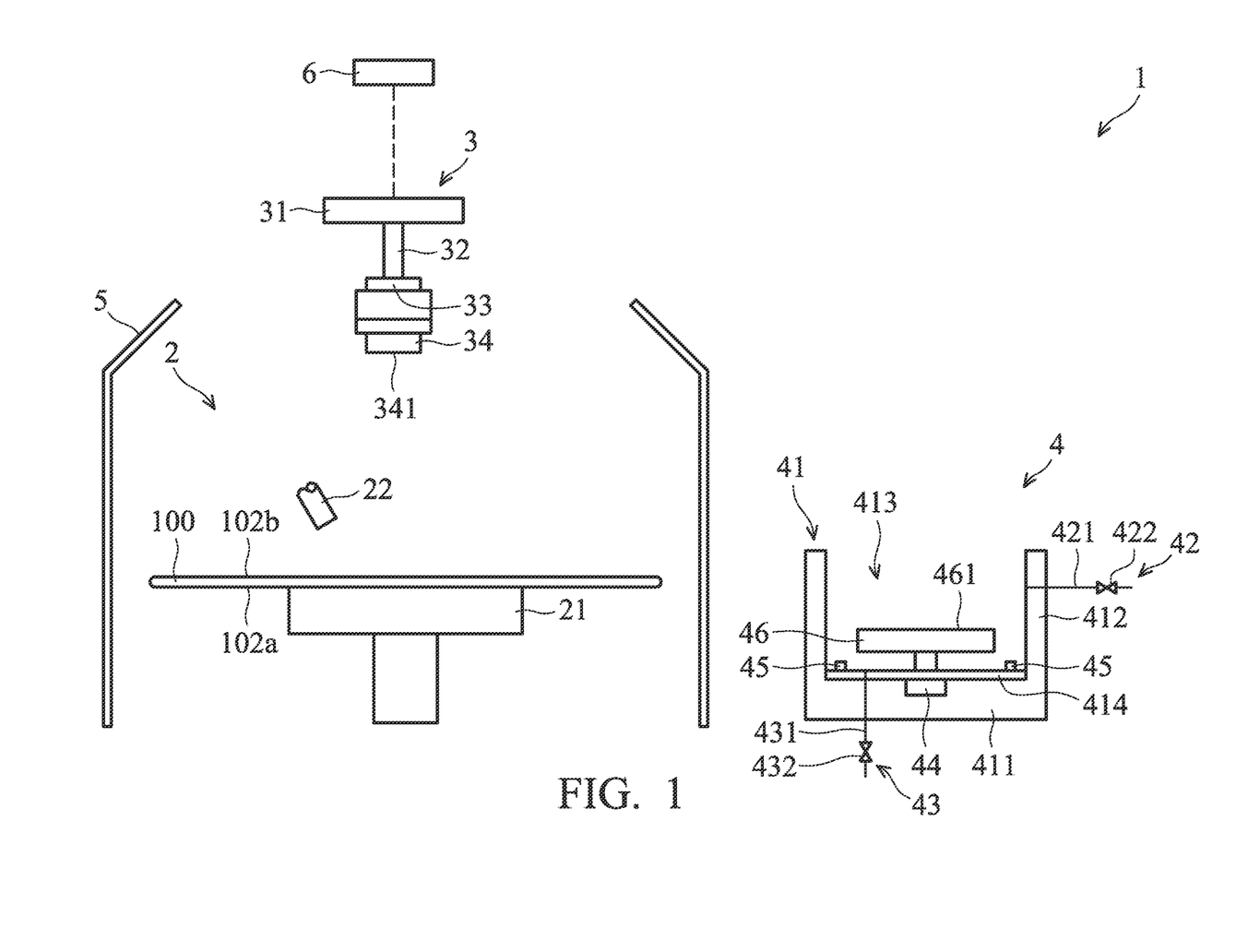
FIG. 1 is cross-sectional view of a system for cleaning a wafer in accordance with some embodiments.

FIG. 1 is a cross-sectional view of a cleaning system 1 for cleaning a wafer in semiconductor manufacturing process, in accordance with some embodiments. The cleaning system 1 includes a wafer cleaning module 2, a scrubber module 3, and a scrubber cleaning module 4. The cleaning system 1 may include a chamber 5. The chamber 5 contains the wafer cleaning module 2. The wafer cleaning module 2 is configured to clean a wafer, such as a wafer 100.

The wafer 100 may be made of silicon or other semiconductor materials. Alternatively or additionally, the wafer 100 may include other elementary semiconductor materials such as germanium (Ge). In some embodiments, the wafer 100 is made of a compound semiconductor such as silicon carbide (SiC), gallium arsenic (GaAs), indium arsenide (InAs), or indium phosphide (InP). In some embodiments, the wafer 100 is made of an alloy semiconductor such as silicon germanium (SiGe), silicon germanium carbide (SiGeC), gallium arsenic phosphide (GaAsP), or gallium indium phosphide (GaInP). In some embodiments, the wafer 100 includes an epitaxial layer. For example, the wafer 100 has an epitaxial layer overlying a bulk semiconductor. In some other embodiments, the wafer 100 may be a silicon-on-insulator (SOI) or a germanium-on-insulator (GOI) substrate.

The wafer 100 may have various device elements. Examples of device elements that are formed in the wafer 100 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The wafer cleaning module 2 includes a wafer holder 21, and a cleaning fluid provider 22, in accordance with some embodiments. The wafer holder 21 is disposed in an enclosure space defined by the chamber 5. The wafer holder 21 is configured to hold and secure the wafer 100 which is to be cleaned. The wafer 100 may be secured on a wafer holder 21 by a clamping mechanism, such as vacuum clamping or e-chuck clamping. The wafer holder 21 may be rotatable in the horizontal plane.

As shown in FIG. 1, the scrubber module 3 includes a robot arm 31, a shaft 32, a brush holder 33, and a scrubber (wafer scrubber) 34, in accordance with some embodiments. The wafer scrubber (or brush) 34 is supported on the distal end of the shaft 32 connected to the robot arm 31 by the brush holder 33. In some embodiments, the wafer scrubber 34 may be made of a suitable polymer material, such as a polyurethane (PU) based sponge, polyvinyl alcohol (PVA)-based sponge, another applicable material, or a combination thereof.

In some embodiments, the shaft 32 is rotatable so that the brush holder 33 and the wafer scrubber 34 may be rotated if needed. The robot arm 31 is vertically and horizontally movable in response to the control of a controller 6. As a result, the wafer scrubber 34 is capable of being transferred between the wafer cleaning module 2 and the scrubber cleaning module 4.

The scrubber cleaning module 4 includes a container 41, a cleaning fluid supply 42, a liquid outlet unit 43, an agitation generator 44, a gas supply 45, and a cleaning stage 46, in accordance with some embodiments.

In some embodiments, the container 41 includes a bottom wall 411, a lateral wall 412, and a lower plate 414. The lateral wall 412 connects to the bottom wall 411 and extends away from the bottom wall 411. As a result, as shown in FIG. 1, a cleaning space 413 is defined by the bottom wall 411 and the lateral wall 412.

In some embodiments, the cleaning fluid supply 42 is connected to the container 41 and is configured to provide a cleaning fluid to the container 41. The cleaning fluid supply 42 includes an inlet line 421 and a valve 422. The inlet line 421 is connected to the lateral wall 412. The valve 422 is used to regulate the flow of the cleaning fluid from a liquid source (not shown in the figures). However, it should be appreciated that many variations and modifications can be made to embodiments of the disclosure. In some embodiments, the container 41 further includes a top wall covering the cleaning space 413, and the inlet line 421 is connected to the top wall of the container 41.

In some embodiments, the liquid outlet unit 43 is connected to the container 41 and is configured to drain away the liquid in the container 41. The liquid outlet unit 43 includes an outlet line 431 and a valve 432. The outlet line 431 is connected to the bottom wall 411. The valve 432 regulates the flow of the liquid from the container 41 to a waste processing unit. However, it should be appreciated that many variations and modifications can be made to embodiments of the disclosure. In some embodiments, the outlet line 431 is connected to a portion of the lateral wall 412 that is in the vicinity of the bottom wall 411.

In some embodiments, the system 1 further includes a host computer (not shown in the figures) to control the valves 422 and 432 according to a predetermined setting. Additionally or alternatively, the valves 422 and 432 are controlled in response to a detecting signal produced from a sensor used to detect contamination level of the liquid in the container 41. When the contamination level is higher than a maximum level, the sensor triggers a signal to the host computer to drive the valves 422 and 432.

In some embodiments, the agitation generator 44 is positioned in the cleaning space 413 and placed on the bottom wall 411. The lower plate 414 is connected to the bottom wall 411 via the agitation generator 44. The agitation generator 176 is configured for converting the electrical oscillations into mechanical oscillation. In some embodiments, when the agitation generator 176 is operated, the lower plate 414 is oscillated at an ultrasonic frequency.

In some embodiments, the gas supply 45 is positioned in the cleaning space 413 and placed on the lower plate 414. However, it should be appreciated that many variations and modifications can be made to embodiments of the disclosure. In some other embodiments, the scrubber cleaning module 4 includes a number of gas supplies 45. One or more gas supplies 45 are positioned on the lower plate 414, and the other gas supplies 45 are positioned on the lateral wall 412. The gas supplies 45 can be placed in any position in the cleaning space 413 as long as the gas supplies 45 can be immersed by a cleaning fluid in the scrubber cleaning module 4.

In some embodiments, the gas supply 45 is configured for providing air bubbles into the cleaning space 413. In some other embodiments, the gas supply 45 is configured for providing a compressed air stream. The gas from the gas supply 45 is compressed by a pump to an air pressure, and a high-pressure air stream is supplied into the cleaning space 413 and utilized to remove the particles in the wafer scrubber.

In some embodiments, the cleaning stage 46 is positioned in the cleaning space 413 and placed on the lower plate 414. The cleaning stage 46 may be placed in the center of the cleaning space 413. The cleaning stage 46 has a top surface 461 which faces an opening of the cleaning space 413. In some embodiments, the top surface 461 is used to rub the wafer scrubber 34 to remove the particle on the wafer scrubber 34. The top surface 461 may have dimensions which are compatible to those of a lower surface 341 of the wafer scrubber 34. Alternatively, the top surface 461 may have larger dimensions than those of the lower surface 341.

Figures 2A, 2B:
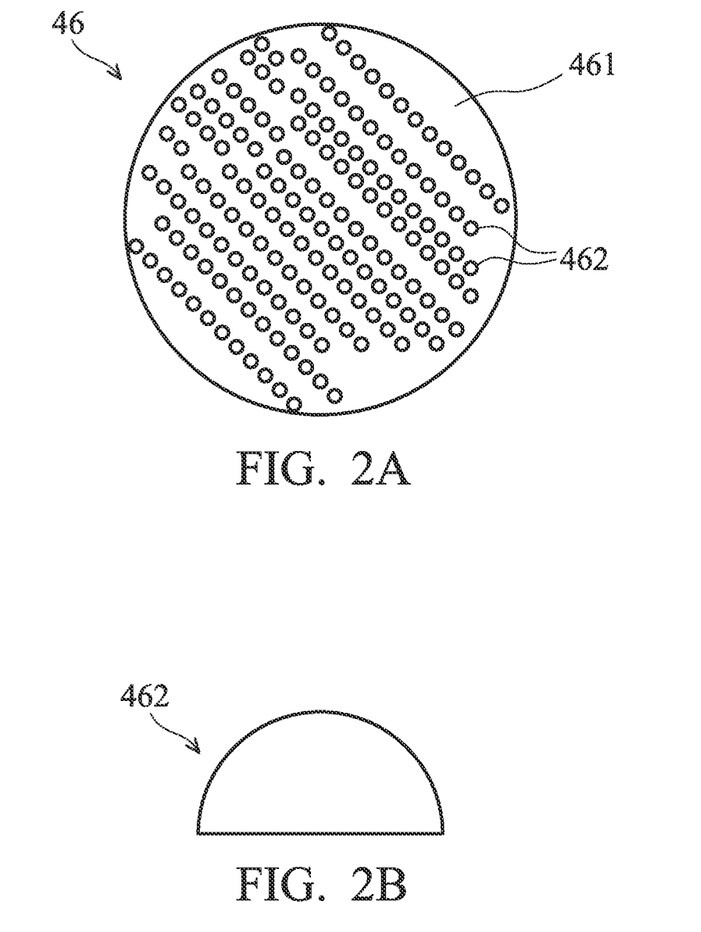
FIG. 2A is top view of a cleaning stage of a cleaning system, in accordance with some embodiments.
FIGS. 2B and 2C are enlarged cross-sectional views of an embossed member of a cleaning stage of a cleaning system, in accordance with some embodiments.
Figure 2C:
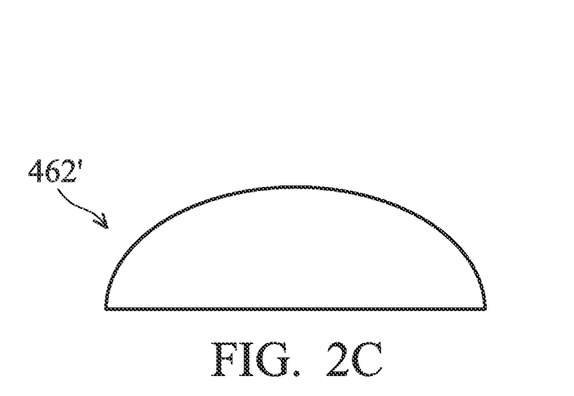

In some embodiments, the top surface 461 of the cleaning stage 46 is a rugged surface including a number of embossed members 463 formed thereon. As shown in FIG. 2A, the embossed members 463 are formed randomly on the top surface 461 of the cleaning stage 46. Each two neighboring embossed members 463 may be spaced apart by a distance. Alternatively or additionally, each two neighboring embossed members 463 may be arranged adjacent to each other. In some embodiments, the embossed members 463 are concentrically arranged on the top surface 461 of the cleaning stage 46.

The outer surface of each embossed member 463 is a curved surface to prevent damage to the wafer scrubber 34. In some embodiments, the embossed members 463 have a semi-circular cross-section, as shown in FIG. 2B. In some embodiments, the embossed members 463 have a semi-elliptical cross-section. However, it should be appreciated that many variations and modifications can be made to embodiments of the disclosure. The embossed members 463 may have any configuration. In some embodiments, there is no embossed member formed on the top surface 461 of the cleaning stage 46. The top surface 461 of the cleaning stage 46 may have a number of wavy straps including a number of peaks.

Figure 3:
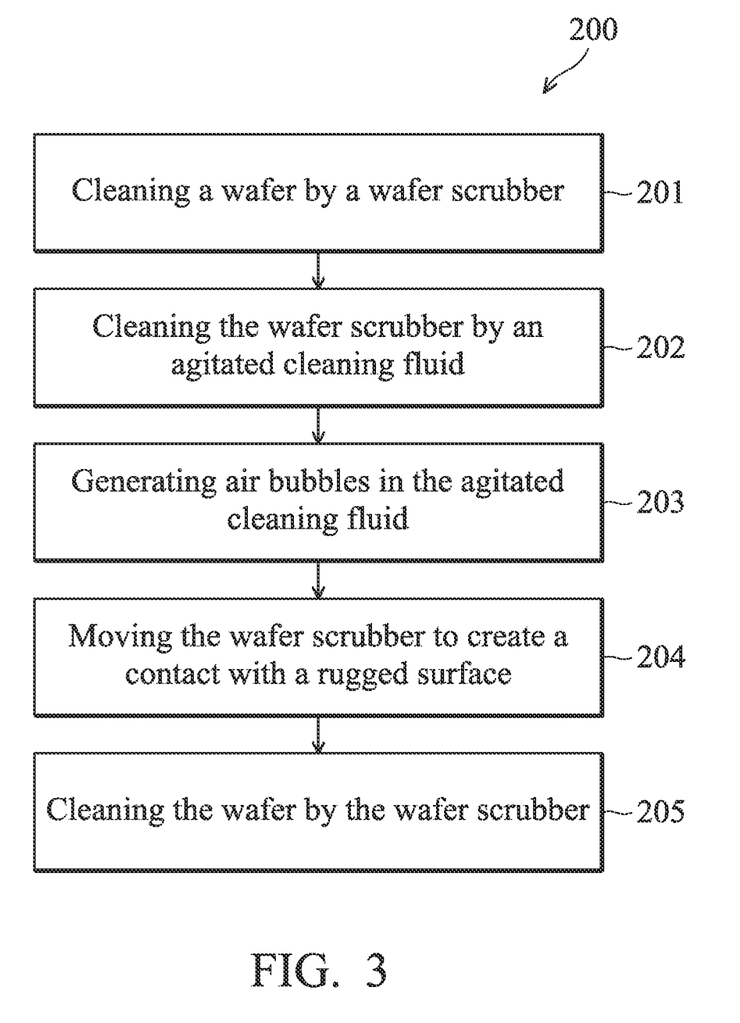
FIG. 3 is a flow chart of methods for cleaning a wafer, in accordance with some embodiments.
Figure 4:
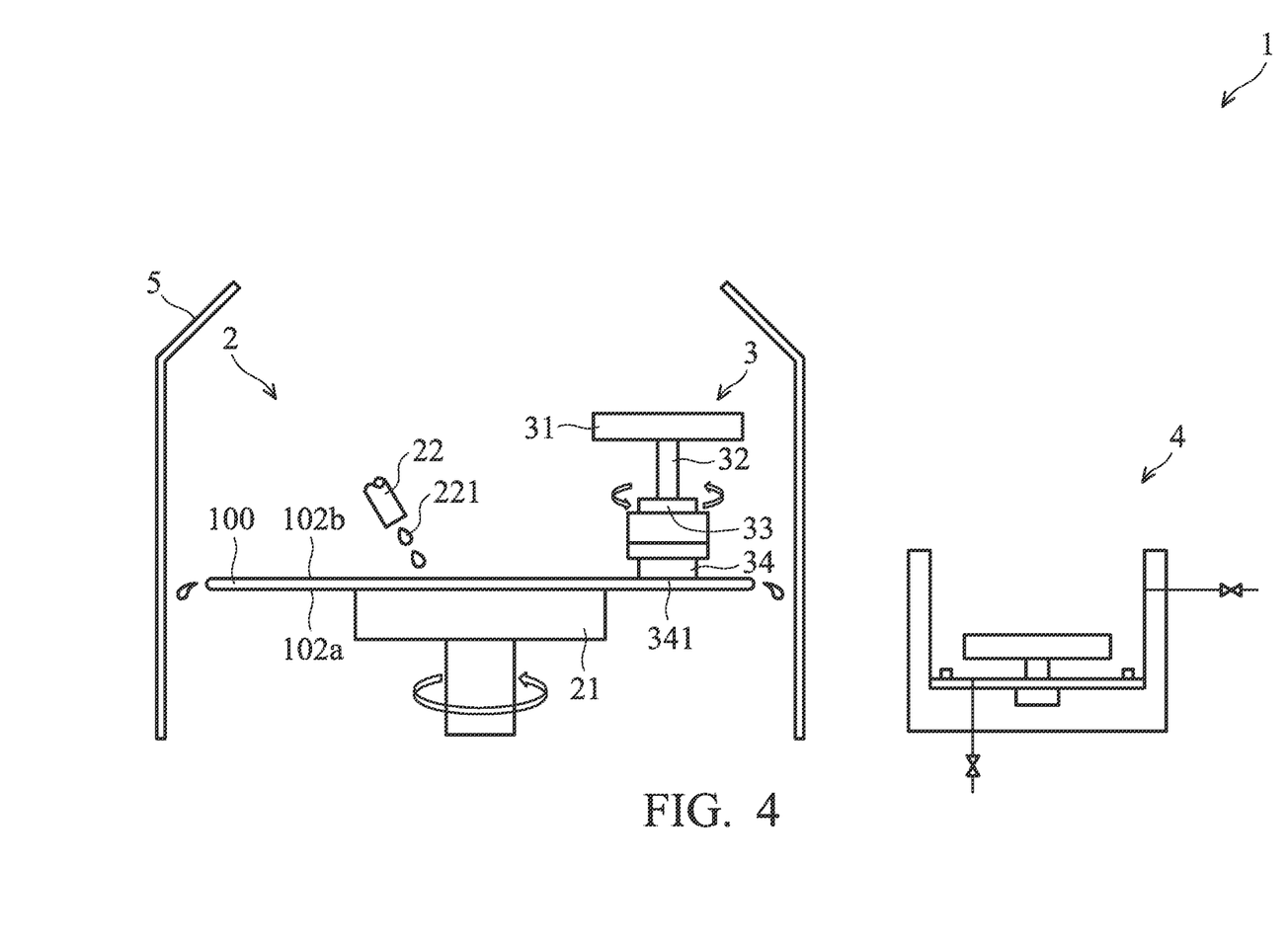
FIG. 4 is a cross-sectional view of one cleaning stage of a process for cleaning a wafer in a cleaning system, in accordance with some embodiments.
Figure 5A:
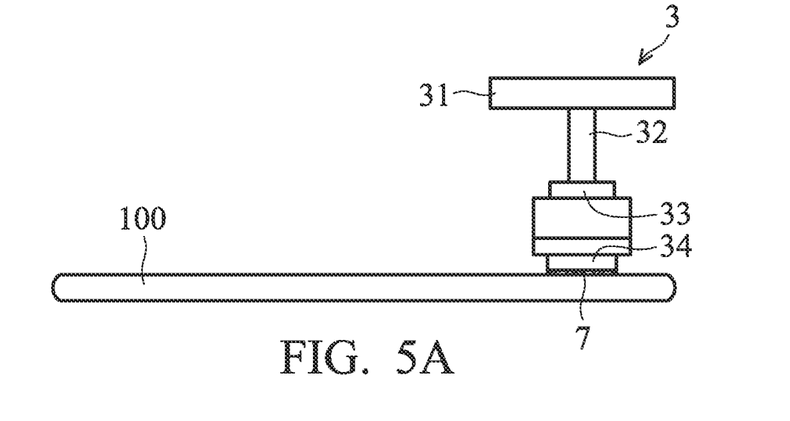
FIGS. 5A-5C are cross-sectional views of a scrubber after being used to clean different wafers, in accordance with some embodiments.
Figure 5B:
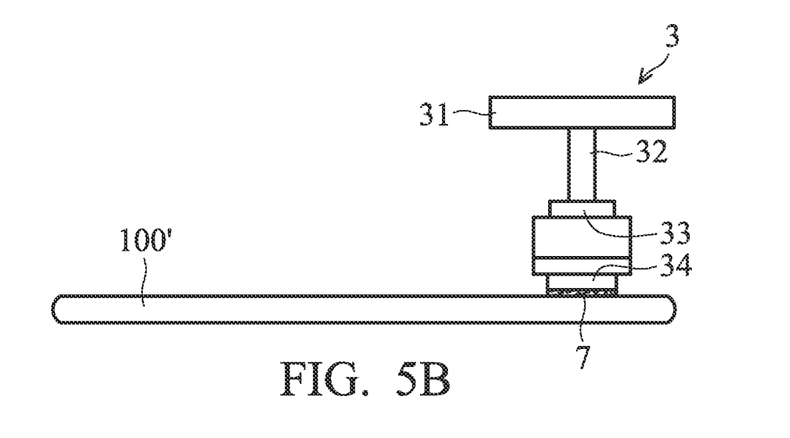
Figure 5C:
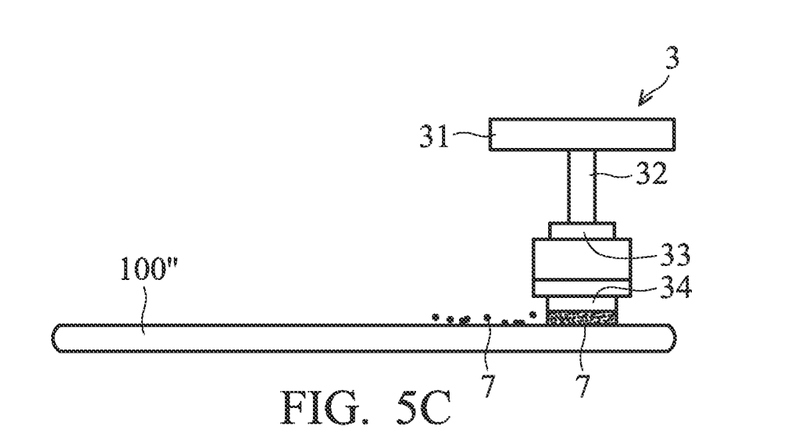
Figure 6A:
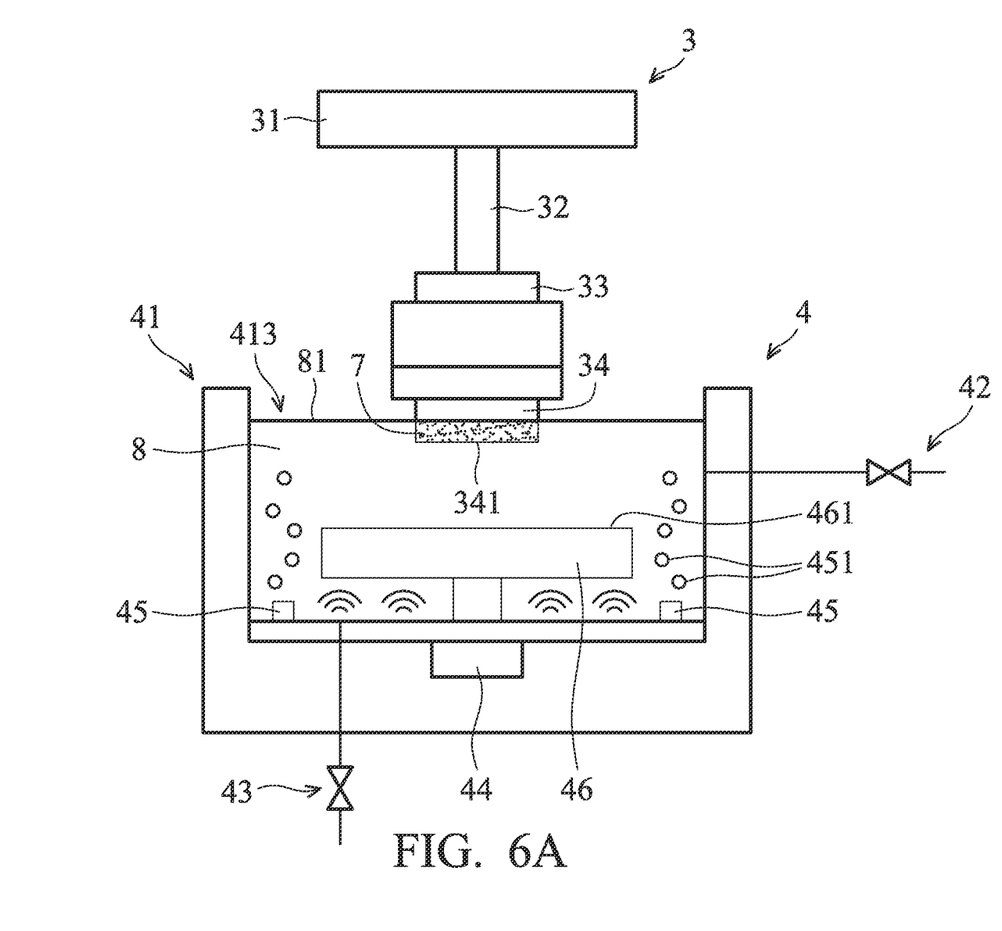
FIGS. 6A and 6B are cross-sectional views of cleaning stages of a process for cleaning a wafer in a cleaning system, in accordance with some embodiments.
Figure 6B:
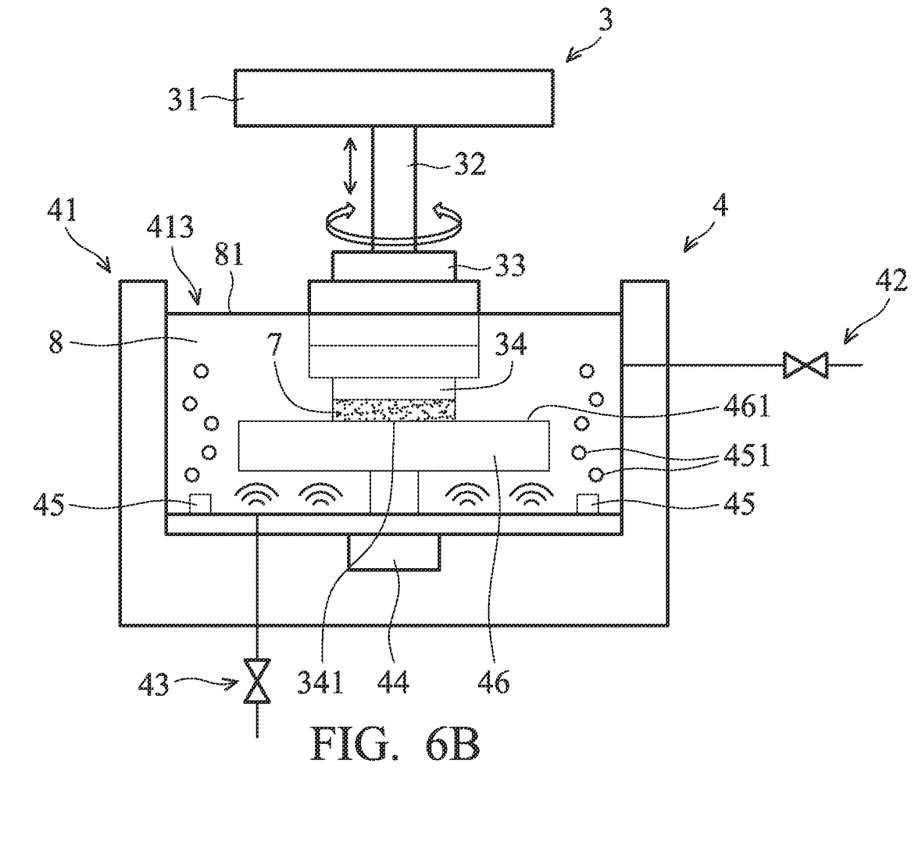

FIG. 3 is a flow chart illustrating a method 200 for cleaning a wafer, in accordance with some embodiments. FIGS. 4-6 are cross-sectional views of one cleaning stage of a process for cleaning a wafer in a cleaning system, in accordance with some embodiments.

The method 200 begins with an operation 201 in which one or more wafer (such as wafer 100) is cleaned using a scrubber, such as the wafer scrubber 34. As shown in FIG. 4, in some embodiments, the scrubber module 3 is lowered to bring the wafer scrubber 34 into contact with the back surface 102b of the wafer 100. The wafer 100 is also rotated by the wafer holder 21. The wafer scrubber 34 is suitable for removing particles and/or contaminants from the wafer 100. In some embodiments, a cleaning fluid provider 22 provides a cleaning fluid 221 on the wafer 100 during the wafer cleaning operation. When the cleaned wafer scrubber 34 touches the wafer 100, which is rotating, particles on the wafer 100 are removed by the wafer scrubber 34 and the cleaning fluid 221.

In some embodiments, the wafer scrubber 34 is gradually moved inward from the edge to the center of wafer 100. Alternatively, the wafer scrubber 34 is gradually moved outward from the center to the edge of the wafer 100. Because the wafer 100 is rotated, the back surface 102b is entirely rubbed by the wafer scrubber 34. As a result, particles and/or contaminants on the wafer 100 are removed by wafer scrubber 34 so that the back surface 102b is cleaned.

However, when the wafer scrubber 34 is used to clean the wafer(s) for a while, the cleaning efficiency would be reduced due to particles (or contaminants) accumulating on the wafer scrubber 34. FIGS. 5A-5C are cross-sectional views of the wafer scrubber 34 after being used to clean different wafers, in accordance with some embodiments.

As shown in FIG. 5A, after the wafer 100 is cleaned using the wafer scrubber 34, contaminating particles 7 (or contaminants) accumulate on the wafer scrubber 34. As shown in FIG. 2B, after the wafer scrubber 34 is further used to clean more wafers including a wafer 100', more contaminating particles 7 accumulate on the wafer scrubber 34. As the wafer scrubber 34 is continually used for cleaning wafers, more and more contaminating particles 7 may adhere to the wafer scrubber 34 and contaminate the wafer scrubber 34. Therefore, when the wafer scrubber 34 is used to clean a new wafer, some of the particulate contaminants may fall on the new wafer, degrading the cleaning effect of the wafer scrubber 34.

For example, as shown in FIG. 5C, after the wafer scrubber 34 continues to be used to clean even more wafers including a wafer 100", even more contaminating particles 7 accumulate on the wafer scrubber 34. In some embodiments, some of contaminating particles 7 fall from the wafer scrubber 34 and are left on the wafer 100". As a result, the wafer 100" is not sufficiently cleaned, which will lead to a yield reduction of the wafer 100".

In order to prevent the problems mentioned above, the method 200 continues to an operation 202, in which the wafer scrubber 34 is moved into a scrubber cleaning module (such as the scrubber cleaning module 4) to be washed and cleaned by an agitated cleaning fluid.

Referring to FIG. 6A, in some embodiments, before the wafer scrubber 34 is placed into the container 41, a cleaning fluid 8 is provided or ejected by the cleaning fluid supply 42. The cleaning fluid 8 may include deionized water, NH4OH solution, H2O2 solution, HCl solution, or a combination thereof.

Afterwards, the cleaning fluid 8 is ultrasonically agitated by an agitation generator 44. The agitation generator 44 is capable of agitating the cleaning fluid 8 at a frequency in a range from about 10 KHz to about 500 KHz. The power supplied to the agitation generator is from about 20 W to about 100 W. Due to the ultrasonic agitation of the cleaning fluid 8, contaminating particles 7 adhering to the wafer scrubber 34 are shaken away from the wafer scrubber 34 and dispersed in the cleaning fluid 8 held by the container 41.

In some embodiments, the frequency of oscillation is varied according to the particle size accumulated in the wafer scrubber 34. For example, if the particles accumulated in the wafer scrubber 34 have a relatively large size, the cleaning fluid 8 is oscillated at a low frequency, so that the cleaning efficiency is enhanced. However, it should be appreciated that many variations and modifications can be made to embodiments of the disclosure.

In some embodiments, the cleaning fluid 8 is not supplied into the container 41 before the wafer scrubber 34 is placed into the container 41. The agitation generator 44 may be operated at the beginning of the supply of the clean water 30 from the cleaning fluid supply 42.

The method 200 continues to an operation 203, in which air bubbles 451 are generated in the agitated cleaning fluid 8. In some embodiments, the air bubbles 451 are generated by a gas supply (such as the gas supply 45). The gas supply 45 may connected to a gas source. Gas provided from the gas source to the gas supply 45 may include nitrogen gas, argon gas, or any other noble gas. However, it should be appreciated that many variations and modifications can be made to embodiments of the disclosure. The gas provided from the gas source can be any suitable gas.

In some embodiments, the flow rate of the gas supplied by the gas supply 45 is adjusted according to the particle size accumulated in the wafer scrubber 34 or according to the contamination level of the liquid held by the container 41. For example, if the contamination level of the cleaning fluid 8 is higher than a critical value, the flow rate of the gas supplied by the gas supply 45 is adjusted to flow at a higher flow rate, so that the clean efficiency is enhanced. However, it should be appreciated that many variations and modifications can be made to embodiments of the disclosure.

In some embodiments, the gas provided from the gas source to the gas supply 45 is compressed to a higher pressure before it is provided into the cleaning fluid 8. As a result, a gas stream is ejected by the gas supply 175. In some embodiments, the gas stream is supplied toward the wafer scrubber 34, and the particles on the wafer scrubber 34 are washed away by the gas stream.

Referring to FIG. 6B, the method 200 continues to an operation 204, in which the wafer scrubber 34 is moved so as to create a contact with a rugged surface (such as the rugged surface 461 of the cleaning stage 46.) In some embodiments, the wafer scrubber 34 is vertically transferred into the container 41. After the wafer scrubber 34 is dipped into the agitated cleaning fluid 8, the wafer scrubber 34 is sequentially moved toward the rugged surface 461 of the cleaning stage 46 until a contact between the lower surface 341 of the wafer scrubber 34 and the rugged surface 461 of the cleaning stage 46 is created.

In some embodiments, after the contact between the lower surface 341 and the rugged surface 461 is created, a thrust force is applied on the wafer scrubber 34 via the robot arm 31, so that a contact pressure between the lower surface 341 and the rugged surface 461 is generated. The contact pressure between the wafer scrubber 34 and the cleaning stage 46 may be from about 1 N/m² to about 10 N/m². Alternatively, the contact pressure ranges from about 1 N/m² to about 5 N/m². Due to the contact pressure, the wafer scrubber 34 is forcibly pressed and deformed. As a result, the contamination liquid contained in the wafer scrubber 34 is expelled from the wafer scrubber 34.

In some embodiments, the thrust force is continuously applied as the scrubber cleaning process is performed. Since the contact pressure persists during the scrubber cleaning operation, the wafer scrubber 34 is not separated from the cleaning stage 46 during the scrubber cleaning operation. The contact pressure may be varied according to processing time. The thrust force applied on the wafer scrubber 34 may be applied along a direction perpendicular to the rugged surface 461. Alternatively, the thrust force applied on the wafer scrubber 34 may be applied along an inclined direction relative to the rugged surface 461.

In some embodiments, a reciprocating movement of the wafer scrubber 34 is performed, in which the wafer scrubber 34 is moved to alternately create the contact between the wafer scrubber 34 and the cleaning stage 46 and detach the wafer scrubber 34 from the cleaning stage 46. For example, the wafer scrubber 34 is moved away from the rugged surface 461 of the cleaning stage 46 after the contact is created. Afterwards, the wafer scrubber 34 is moved close to the cleaning stage 46 again to create the contact therebetween. The wafer scrubber 34 may be moved up and down along a vertical direction. Alternatively, the wafer scrubber 34 may be swung at an angle in a range from about 30 degrees to about 90 degrees.

In some embodiments, during the reciprocating movement, the lower surface 341 of the wafer scrubber 34 is kept in the agitated cleaning fluid 8. Namely, as shown in FIG. 6A, the lower surface 341 of the wafer scrubber 34 is moved away from the cleaning stage 46 to a position no higher than the liquid surface 81 of the agitated cleaning fluid 8. In some embodiments, a time period for alternating the operation of creating the contact between the wafer scrubber 34 and the cleaning stage 46 and the operation of detaching the wafer scrubber 34 from the cleaning stage 46 ranges from about 10 seconds to 20 seconds, so that the scrubber is cleaned efficiently. Alternatively, the time period rages from about 5 seconds to 10 seconds.

In some embodiments, during the contact of the wafer scrubber 34 and the cleaning stage 46, the wafer scrubber 34 is rotated by the shaft 32 in the cleaning fluid 8. With the friction force formed between the embossed members 463 and the wafer scrubber 34, the removal of contaminating particles 7 adhering to the wafer scrubber 34 is greatly enhanced. In some embodiments, the cleaning stage 46 is also rotatable relative to the wafer scrubber 34. The cleaning stage 46 is rotated during the scrubber cleaning operation.

The method 200 continues to an operation 205, in which the wafer scrubber 34 which is cleaned is moved to the wafer cleaning module 2 (FIG. 3) to clean another wafer 100' or the remaining portion of wafer 100 which has not been cleaned.

In some embodiments, once the wafer scrubber 34 is removed from the scrubber cleaning module 4, the cleaning fluid 8 dispersed with contaminating particles 7 is drained away through the liquid outlet unit 43. Afterwards, the cleaning fluid supply 42 provides the cleaning fluid 8 into the container 41, and the cleaning fluid 8 is agitated by the agitation generator 176. The scrubber cleaning module 4 is ready for being used for cleaning the wafer scrubber 34 after the wafer scrubber 168 cleaning the wafer 100. Alternatively or additionally, the scrubber cleaning module 4 is ready for being used for cleaning another wafer scrubber from another wafer cleaning module.

In some embodiments, the cleaning fluid 8 dispersed with contaminating particles 7 is held in the container 41 during the scrubber cleaning operation. No cleaning fluid 8 is drained away through the liquid outlet unit 43. In some other embodiments, the cleaning fluid 8 dispersed with contaminating particles 7 is continuously or periodically drained away through the liquid outlet unit 43 during the scrubber cleaning operation. While at the same time, the cleaning fluid supply 42 supplies a new cleaning fluid 8 into the container 41, and the new cleaning fluid 8 is agitated by the agitation generator 176.

Embodiments of mechanisms for cleaning a wafer scrubber described above apply an agitated cleaning fluid on the wafer scrubber. Due to the assistance of the agitation energy, the scrubber is cleaned efficiently. Air bubbles in the agitated cleaning fluid enhance the removal of particles accumulated on the wafer scrubber. In addition, creating the contact between the wafer scrubber and the rugged surface also enhances the removal of particles accumulated on the scrubber. Since the wafer scrubber is reused to clean other wafers, the time period for shutting off the cleaning system for replacing a new wafer scrubber can be prolonged, and fabrication cost and time are reduced.

In accordance with some embodiments, a method for cleaning a wafer in semiconductor fabrication is provided. The method includes cleaning a wafer using a wafer scrubber. The method further includes moving the wafer scrubber into an agitated cleaning fluid. The method also includes creating a contact between the wafer scrubber and a cleaning stage in the agitated cleaning fluid. In addition, the method includes cleaning the wafer or a second wafer by the wafer scrubber after the wafer scrubber is cleaned by the agitated cleaning fluid.

In accordance with some embodiments, a method for cleaning a wafer in semiconductor fabrication is provided. The method includes cleaning a wafer using a wafer scrubber. The method further includes applying an agitated cleaning fluid on the wafer scrubber to clean the wafer scrubber. The agitated cleaning fluid is provided with air bubbles and is agitated at an ultrasonic frequency. The method also includes cleaning the wafer or a second wafer by the wafer scrubber after the wafer scrubber is cleaned by the agitated cleaning fluid.

In accordance with some embodiments, a system for cleaning a wafer in semiconductor fabrication is provided. The system includes a wafer cleaning module used to clean the wafer. The system also includes a scrubber cleaning module used to clean a wafer scrubber used for cleaning the wafer. The scrubber cleaning module includes a cleaning fluid supply, a gas supply, and an agitation generator. The cleaning fluid supply is used to provide a cleaning fluid on the wafer scrubber. The gas supply is used to provide air bubbles to the cleaning fluid. The agitation generator is used to agitate the cleaning fluid. In addition, the scrubber cleaning module includes a cleaning stage. The wafer scrubber is moved relative to the cleaning stage when the wafer scrubber is cleaned by the scrubber cleaning module.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for cleaning a wafer, comprising:
    cleaning the wafer using a wafer scrubber;
    supplying a cleaning fluid into a container and agitating the cleaning fluid;
    moving the wafer scrubber into the agitated cleaning fluid in the container with a lower surface of the wafer scrubber facing a bottom wall of the container;
    supplying air bubbles to the agitated cleaning fluid by discharging a gas by a gas supply positioned on the bottom wall of the container;
    creating a contact between the lower surface of the wafer scrubber and a cleaning stage in the agitated cleaning fluid;
    moving the wafer scrubber alternately into contact with the cleaning stage and detaching from the cleaning stage by moving the wafer scrubber relative to the cleaning stage;
    detecting, in the container, a contamination level of the agitated cleaning fluid;
    adjusting a flow rate of the gas based on the detected contamination level of the agitated cleaning fluid;
    removing the agitated cleaning fluid from the container, wherein an applying and the removal of the agitated cleaning fluid are adjusted in response to an amount of the detected contamination level of the agitated cleaning liquid in the container; and
    cleaning the wafer or a second wafer by the wafer scrubber after the wafer scrubber is cleaned by the agitated cleaning fluid.

2. The method as claimed in claim 1, wherein in moving the wafer scrubber alternately into contact with the cleaning stage and detaching from the cleaning stage, the lower surface of the wafer scrubber is moved away from the cleaning stage to a position no higher than a liquid surface of the agitated cleaning fluid.

3. The method as claimed in claim 1, wherein the operation of moving the wafer scrubber alternately into contact with the cleaning stage and detaching from the cleaning stage in a time period ranging from about 5 seconds to about 10 seconds.

4. The method as claimed in claim 1, further comprising:
    continuously applying a thrust force on the wafer scrubber along an inclined direction relative to the cleaning stage so as to produce a contact pressure to enable a deformation of the wafer scrubber.

5. The method as claimed in claim 1, wherein the contact is created between the wafer scrubber and a rugged surface of the cleaning stage which is formed with a plurality of embossed members.

6. The method as claimed in claim 1, wherein the agitated cleaning fluid is ultrasonically agitated at a frequency in a range from about 10 KHz to about 500 KHz by an agitation generator, and the power supplied to the agitation generator is from about 20 W to about 100 W.

7. A method for cleaning a wafer, comprising:
    cleaning the wafer using a wafer scrubber;
    moving the wafer scrubber into a container with a lower surface of the wafer scrubber facing a bottom wall of the container;
    applying an agitated cleaning fluid on the wafer scrubber to clean the wafer scrubber, wherein the agitated cleaning fluid is agitated at an ultrasonic frequency;
    supplying air bubbles to the agitated cleaning fluid by discharging a gas, with a first flow rate;
    detecting a contamination level of the agitated cleaning fluid in the container, wherein when the contamination level of the cleaning fluid is higher than a critical value, the flow rate of the gas is adjusted from the first flow rate to a second flow rate, wherein the second flow rate is higher than the first flow rate; and
    cleaning the wafer or a second wafer by the wafer scrubber after the wafer scrubber is cleaned by the agitated cleaning fluid.

8. The method as claimed in claim 7, wherein the applying of the agitated cleaning fluid comprises:
    supplying a cleaning fluid to the container; and
    agitating the cleaning fluid held by the container to generate the agitated cleaning fluid.

9. The method as claimed in claim 7, wherein the air bubbles include nitrogen gas or argon gas.

10. The method as claimed in claim 7, wherein the agitated cleaning fluid is agitated at an ultrasonic frequency in a range from about 10 KHz to about 500 KHz.

11. The method as claimed in claim 1, further comprising rotating wafer scrubber in the agitated cleaning fluid during the contact of the wafer scrubber and a cleaning stage.

12. The method as claimed in claim 7, wherein the flow rate of the gas is adjusted according to the particle size accumulated in the wafer scrubber.

13. The method as claimed in claim 7, further comprising:
    moving the wafer scrubber alternately into contact with the rugged surface and detaching from a rugged surface by moving the wafer scrubber relative to the rugged surface; and
    continuously applying a thrust force on the wafer scrubber along an inclined direction relative to the cleaning stage so as to produce a contact pressure to enable a deformation of the wafer scrubber.

14. The method as claimed in claim 7, further comprising:
    compressing the gas;
    providing the compressed gas into the agitated cleaning fluid in the container; and
    applying the compressed gas toward the wafer scrubber.

15. The method as claimed in claim 7, further comprising removing the agitated cleaning fluid from the container;
    wherein the applying and the removal of the agitated cleaning fluid are adjusted in response to a detecting signal produced from a sensor used to detect the contamination level of the agitated cleaning liquid in the container.

16. The method as claimed in claim 1, further comprising:
    compressing the gas;
    providing the compressed gas into the agitated cleaning fluid in the container via the gas supply; and
    applying the compressed gas toward the wafer scrubber.

17. The method as claimed in claim 7, further comprising:
periodically draining away the agitated cleaning fluid in the container via an outlet line connected to the container; and
supplying new cleaning fluid into the container and agitating the new cleaning fluid.

18. A method for cleaning a wafer, comprising:
cleaning the wafer using a wafer scrubber;
supplying a cleaning fluid into a container and agitating the cleaning fluid;
performing a scrubber cleaning operation, wherein the scrubber cleaning operation comprises:
immersing the wafer scrubber into the agitated cleaning fluid held by the container and creating a contact with the scrubber and a cleaning stage in the agitated cleaning fluid;
applying a thrust force on the wafer scrubber to produce a persistent contact pressure over the cleaning stage such that the wafer scrubber remains in contact with the cleaning stage;
discharging a gas to the agitated cleaning fluid with a first flow rate;
detecting, in the container, a contamination level of the agitated cleaning fluid;
adjusting the flow rate of the gas based on the detected contamination level of the agitated cleaning fluid;
detaching the wafer scrubber from the cleaning stage, wherein the scrubber cleaning process is finished once the wafer scrubber is detached from the cleaning stage; and
cleaning the wafer or a second wafer by the wafer scrubber after the scrubber cleaning operation is finished.

19. The method as claimed in claim 18, wherein when the contamination level of the cleaning fluid is higher than a critical value, the flow rate of the gas is increased from the first flow rate.

* * * * *